United States Patent
Takai et al.

(10) Patent No.: US 10,211,237 B2
(45) Date of Patent: Feb. 19, 2019

(54) TRANSPARENT SUBSTRATE AND PROCESS FOR PRODUCING IT

(71) Applicant: AGC Inc., Chiyoda-ku (JP)

(72) Inventors: Azusa Takai, Chiyoda-ku (JP); Satoshi Mototani, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/653,760

(22) Filed: Jul. 19, 2017

(65) Prior Publication Data

US 2018/0033986 A1 Feb. 1, 2018

(30) Foreign Application Priority Data

Jul. 28, 2016 (JP) .................................. 2016-148399

(51) Int. Cl.
| | |
|---|---|
| *H01L 27/12* | (2006.01) |
| *G02F 1/1335* | (2006.01) |
| *G02F 1/1333* | (2006.01) |
| *G03F 1/46* | (2012.01) |
| *H01L 33/44* | (2010.01) |
| *B60R 1/00* | (2006.01) |
| *G06F 3/041* | (2006.01) |
| *H01B 5/14* | (2006.01) |
| *H01L 33/00* | (2010.01) |
| *H01L 51/44* | (2006.01) |
| *H05K 1/02* | (2006.01) |

(52) U.S. Cl.
CPC .......... *H01L 27/1259* (2013.01); *B60R 1/001* (2013.01); *G02F 1/133308* (2013.01); *G02F 1/133502* (2013.01); *G02F 1/133504* (2013.01); *G03F 1/46* (2013.01); *G06F 3/041* (2013.01); *H01B 5/14* (2013.01); *H01L 33/0079* (2013.01); *H01L 33/44* (2013.01); *H01L 51/442* (2013.01); *H05K 1/0213* (2013.01); *H05K 1/0274* (2013.01); *G02F 2001/133507* (2013.01)

(58) Field of Classification Search
CPC .......... G02F 1/33308; G02F 1/133502; G02F 1/133504; G02F 2001/133507; B60R 1/001; G03F 1/46; H01L 33/44; H01L 27/1259
See application file for complete search history.

(56) References Cited

U.S. PATENT DOCUMENTS

2016/0238894 A1* 8/2016 Choi ................. G02F 1/133603

FOREIGN PATENT DOCUMENTS

| JP | 2009-058640 | 3/2009 |
|---|---|---|
| JP | 4893539 | 3/2012 |

* cited by examiner

*Primary Examiner* — Fei Fei Yeung Lopez
(74) *Attorney, Agent, or Firm* — Oblon, McClelland, Maier & Neustadt, L.L.P.

(57) ABSTRACT

To provide a transparent substrate with excellent appearance and with high visibility when observed from a predetermined direction, and a process for producing it. A transparent substrate comprising a substrate having a curved surface on at least a part of its front surface, and an antiglare layer formed on the center region and the edge region of the curved surface, wherein the absolute value of the difference between the 60° specular glossiness at the center region and the 60° specular glossiness at the edge region is higher than 20%.

16 Claims, 4 Drawing Sheets

TRANSPARENT SUBSTRATE AND PROCESS FOR PRODUCING IT

FIELD OF INVENTION

The present invention relates to a transparent substrate having a curved portion and a process for producing it.

BACKGROUND OF INVENTION

With respect to an image display device (for example, a liquid crystal display, an organic EL display or a plasma display) attached to various equipment (for example, a television, a personal computer, a smart phone or a mobile phone), if outside light such as indoor lighting (such as fluorescent light) or sunlight is reflected in a display surface, visibility will decrease due to the reflected image. In recent years, use of image display devices having a curved or bent display surface is increasing, an becomes more important to suppress such reflection.

As a method to suppress reflection of outside light, a method of disposing an antiglare film having irregularities on its surface, on the display surface of an image display device to diffusely reflect the outside light thereby to blur the reflected image may be mentioned.

However, in the case of a curved or bent substrate, depending upon its application or a device to which it is applied, it is also necessary to control the antiglare performance in accordance with the state of the curved surface or the like, not to impart uniform antiglare performance to the entire surface. Particularly in a case where the substrate is used for a front panel of a display e.g. for on-vehicle, in order to achieve a display device with excellent appearance and with high visibility, it is known that a display device with high antiglare property from a certain direction and with low antiglare property from another direction is preferred in some cases.

PRIOR ART DOCUMENT

Patent Document

Patent Document 1: JP-A-2009-058640

SUMMARY OF INVENTION

Technical Problem

Under these circumstances, it is an object of the present invention to provide a transparent substrate with excellent appearance and with high visibility when observe from a predetermined direction, and a process for producing it.

Solution to Problem

According to an embodiment of the present invention, the transparent substrate comprises a substrate having a curved surface on at least a part of its front surface, and an antiglare layer formed on the center region and the edge region of the curved surface, wherein the absolute value of the difference between the 60° specular glossiness at the center region and the 60° specular glossiness at the edge region is higher than 20%.

According to another embodiment of the present invention, the process for producing a transparent substrate comprises a step of preparing a substrate having a curved surface on at least a part of its front surface, a step of dipping the substrate in a treatment liquid, and a step of taking the substrate out from the treatment liquid so that the absolute value of the difference between the 60° specular glossiness at the center region and the 60° specular glossiness at the edge region is higher than 20%.

According to still another embodiment of the present invention, the process for producing a transparent substrate comprises a step of preparing a substrate having a curved surface on at least a part of its front surface, a step of disposing a nozzle on the curved surface of the substrate, a step of discharging a coating liquid containing silicon from the nozzle to form a coating film on the substrate, and a step of baking the coating film, wherein the area of a discharge port of the nozzle is at most 20% of the area of the substrate as observed from the direction of the nozzle.

Advantageous Effects of Invention

A transparent substrate with excellent appearance and with high visibility when observed from a predetermined direction, and a process for producing it, can be provided.

DETAILED DESCRIPTION OF INVENTION

The following definitions of terms are applicable throughout description and claims.

A "curved portion" means a portion having an average curvature being not zero.

A "silica precursor" means a substance capable of forming a matrix containing $SiO_2$ as the main component by baking.

"Containing $SiO_2$ as the main component" means that $SiO_2$ is contained in an amount of at least 90 mass %.

"Scaly particles" mean particles having a flat shape. The shape of particles can be confirmed by a transmission electron microscope (hereinafter sometimes referred to as TEM).

The "60° specular glossiness" is measured by the method in JIS Z8741:1997 (ISO2813:1994) without eliminating back (that is, the opposite side from the side on which the antiglare film is formed) reflection. In general, the antiglare property tends to increase when the 60° specular glossiness is low. On the other hand, when the 60° specular glossiness is high, the visibility tends to increase and the resolution tends to be favorable when the substrate is used as a cover glass of a display.

The "haze" is measured by a method in accordance with JIS K7136:2000 (ISO14782:1999).

The "arithmetic mean roughness Ra" is measured by the method in accordance with JIS B0601:2001 (ISO4287:1997).

The "average particle size" means a particle size at a point of 50% on an accumulative volume distribution curve drawn by obtaining the volume-based particle size distribution and taking the whole to be 100%, that is, a volume-based accumulative 50% size (D50). The particle size distribution is obtained from frequency distribution and an accumulative volume distribution curve measured by a laser diffraction/scattering particle size distribution measuring apparatus.

The "aspect ratio" means the ratio of the maximum length relative to the thickness of a particle (maximum length/thickness), and the "average aspect ratio" is an average of aspect ratios of 50 randomly selected particles. The thickness of a particle is measured by an atomic force microscope (hereinafter sometimes referred to as AFM), and the maximum length is measured by a TEM.

Transparent Substrate

First Embodiment

Figure 1:
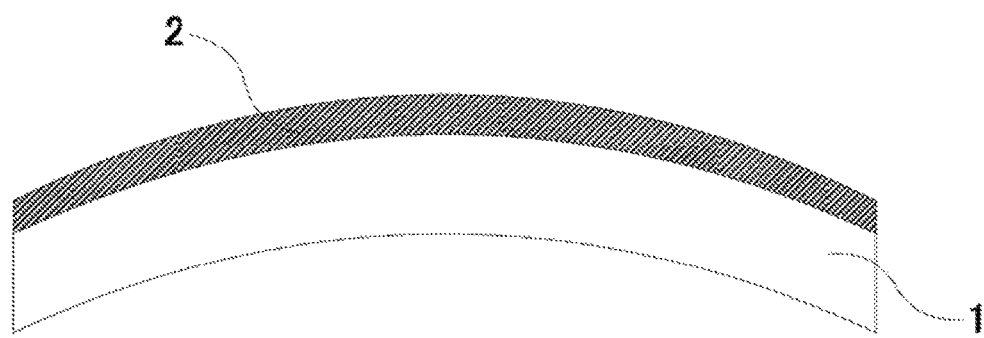
FIG. 1 is a cross-sectional view schematically illustrating a transparent substrate according to a first embodiment of the present invention.

A transparent substrate according to a first embodiment of the present invention comprises, for example, as shown in FIG. 1, a substrate 1 having a curved surface and an antiglare layer 2 formed on the substrate 1. Now, the transparent substrate according to the first embodiment of the present invention will be described with reference to FIG. 1.

The antiglare layer 2 may be a layer formed by roughening the surface of the substrate 1 e.g. by etching, or may be a roughened layer formed on the substrate 1. The antiglare layer 2 has irregularities with a predetermined roughness. In this embodiment, the antiglare layer 2 is formed on the convex surface side of the curved surface of the substrate 1. In the transparent substrate according to this embodiment, the 60° specular glossiness at the edge region close to the edge portion of the curved surface is high as compared with the 60° specular glossiness at the center region on the curved surface in the same substrate. In the transparent substrate according to this embodiment, the difference of the absolute value between the 60° specular glossiness at the center region and the 60° specular glossiness at the edge region is higher than 20%. The 60° specular glossiness is more preferably from 80 to 120 at the center region and is from 100 to 140 at the edge region.

In this embodiment, the curve direction means the circumferential direction when the curved portion is observed from the cross-sectional direction. Further, in this embodiment, when the glass plate is placed on a flat surface so that the convex side faces upward, and the ground point on the flat surface is taken as a height 0% and the point farthest from the flat surface is taken as a height 100%, the center region of the curved surface means a region with a 90 to 100% height, and the edge region of the curved surface means a region with a 0 to 10% height.

The curvature radius of the curved portion is preferably at most 5,000 mm, more preferably at most 3,000 mm, further preferably at most 1,000 mm, particularly preferably at most 500 mm. When the curvature radius is at most the upper limit value, optical properties such as the 60° specular glossinesses at the center region and at the edge region in this embodiment will be easily adjusted.

The lower limit value of the curvature radius of the curved portion is not particularly limited, but is preferably at least 1 mm, more preferably at least 5 mm, further preferably at least 10 mm. When the curvature radius of the curved portion is at least the lower limit value, the substrate having such a curved surface looks smoothly connected to another member around the substrate.

The curve depth at the curved portion is at most 1,000 mm, preferably at most 800 mm, more preferably at most 500 mm, further preferably at most 200 mm. When the substrate has a curved portion having a curve depth of at most the upper limit value, optical properties such as the 60° specular glossinesses at the center region and at the edge region in the present embodiment be easily adjusted.

The curve depth at the curved portion is preferably at least 3 mm, more preferably at least 5 mm, further preferably at least 10 mm, particularly preferably at least 20 mm although the lower limit value of the curve depth is not particularly limited. When the curve depth at the curved portion is at least the lower limit value, a substrate having such a curved portion looks smoothly connected to another member around the substrate. Further, in a case where the substrate having a curved portion is made of glass, rigidity of the substrate will improve, and deformation in the assembling step and inadvertent deformation by the pressure by fingers at the time of use can be suppressed.

The curve depth means a distance between a straight line connecting two edges on the same principal plane of the substrate having a curved portion as cross-sectionally observed in the thickness direction, and a tangent line in contact with the curved portion which is in parallel with the straight line.

The substrate having a curved portion may have a twist structure in the curved portion. "Twist" herein means a shape which does not necessarily have a constant curvature radius and which does not necessarily have a constant angle of aperture at the curved portion. Further, the substrate having a curved portion may have a flat portion.

The surface roughness Ra of the antiglare layer 2 is preferably at least 0.01 μm and at most 0.7 μm, more preferably at least 0.02 μm and at most 0.4 μm. The antiglare layer 2 may have a surface roughness Ra increasing from the center region of the curved surface toward the edge region in the curve direction. The higher the surface roughness Ra, the more the hand feeling improves, and accordingly the difference in the position between the center region and the edge region can be felt by touching.

The material of the substrate 1 may, for example, be glass or a resin. When glass is used, chemically tempered glass is preferred. In a case where chemically tempered glass is used, it preferably has a maximum surface compressive stress of at least 500 MPa and a compressive stress layer depth of at least 10 μm. When glass having the values within the above ranges is used, a substrate having excellent strength and scratch resistance as compared with a resin can be obtained, and the substrate can be suitably used as a cover glass of a display. When the glass is aluminosilicate glass having a glass composition comprising at least 60 mol % of $SiO_2$ and at least 8 mol % of $Al_2O_3$, a higher surface compressive stress and a deeper compressive stress layer depth can be realized, and such a substrate is suitable for a cover glass of a display for on-vehicle for which the safety is important. In a case where glass is used, the thickness of the substrate 1 is from about 0.5 to about 3 mm.

In a case where a roughened layer is formed on the substrate 1, the antiglare layer 2 is a film of which the matrix contains silica as the main component. The silica matrix preferably contains scaly particles such as scaly silica particles, scaly alumina particles, scaly titania particles or scaly zirconia particles. In the case of the scaly silica particles, the $SiO_2$ purity of the scaly silica particles is preferably at least 90 mass %, more preferably at least 95 mass %.

The average aspect ratio of the scaly particles is preferably from 50 to 650, more preferably from 100 to 350, further preferably from 170 to 240. When the average aspect ratio of the scaly particles is at least 50, cracking and film peeling of the antiglare layer 2 can be suppressed even though the antiglare layer 2 is thick. When the average aspect ratio of the scaly particles is at most 650, such particles have favorable dispersion stability in the coating composition. The average particle size of the scaly particles is preferably from 0.08 to 0.42 µm, more preferably from 0.17 to 0.21 µm.

The scaly silica particles are flaky silica primary particles, or silica secondary particles having a plurality of flaky silica primary particles aligned and overlaid with their planes in parallel with each other. The silica secondary particles are usually particles having a laminated structure. The scaly silica particles may be composed of either one of the silica primary particles and the silica secondary particles or of both of them.

The thickness of the silica primary particles is preferably from 0.001 to 0.1 µm. When the thickness of the silica primary particles is within the above range, scaly silica secondary particles having one or a plurality of the silica primary particles aligned with their planes in parallel with each other can be formed. The ratio of the minimum length to the thickness (minimum length/thickness) of the silica primary particles is preferably at least 2, more preferably at least 5, further preferably at least 10.

The thickness of the silica secondary particles is preferably from 0.001 to 3 µm, more preferably from 0.005 to 2 µm. The ratio of the minimum length to the thickness of the silica secondary particles is preferably at least 2, more preferably at least 5, further preferably at least 10. The silica secondary particles are preferably independently present without fusion.

The transparent substrate according to this embodiment may have a functional film on the antiglare layer 2. Such a functional film may, for example, be specifically an antireflection film, an antifouling film, an infrared shielding film, an ultraviolet shielding film, a water repellent film or an antistatic film. The transparent substrate may have any one of the above films or may have a combination of them.

The constitution of the antireflection film is not particularly limited so long as it can suppress reflection of light, and for example, the antireflection film may be a stacked layer of a high refractive index layer having a refractive index at a wavelength of 550 nm of from 1.70 to 2.70 and a low refractive index layer having a refractive index of from 1.30 to 1.55, or a film which contains a layer having a refractive index at a wavelength of 550 nm of from 1.2 to 1.4 and containing hollow particles and holes in the film matrix.

The materials of the high refractive index layer and the low refractive index layer are not particularly limited and are properly selected considering the degree of the antireflection property required, the productivity, etc. The material constituting the high refractive index layer may, for example, be preferably at least one member selected from niobium oxide ($Nb_2O_5$), titanium oxide ($TiO_2$), zirconium oxide ($ZrO_2$), tantalum oxide ($Ta_2O_5$) and silicon nitride (SiN). The material constituting the low refractive index layer is preferably at least one member selected from silicon oxide ($SiO_2$), a material containing a mixed oxide of Si and Sn, a material containing a mixed oxide of Si and Zr, and a material containing a mixed oxide of Si and Al.

In a case where an antifouling film is formed, it is preferably formed as the outermost layer on the antiglare layer 2 or on other functional film. The thickness of the antifouling film is not particularly limited, and in a case where the antifouling film is composed of a fluorinated organic silicon compound coating film, its film thickness is preferably from 2 to 20 nm, more preferably from 2 to 15 nm, further preferably from 2 to 10 nm.

In a case where an antifouling film is formed, the coefficient of static friction of the surface of the outermost layer is preferably at most 1.0, more preferably at most 0.9, further preferably at most 0.8. When the coefficient of static friction is at most 1.0, favorable finger sliding property will be obtained when fingers touch the surface of the transparent substrate. Further, the coefficient of dynamic friction is preferably at most 0.02, more preferably at most 0.015, further preferably at most 0.01.

The coefficient of static friction and the coefficient of dynamic friction of the surface of the outermost layer may be measured, for example, as follows. In a haptics evaluation and measuring apparatus TL201Ts manufactured by Trinity-Lab, Inc., an artificial finger contactor manufactured by Trinity-Lab, Inc. is placed on the outermost layer of the substrate to be measured with a load of 30 g applied. The artificial finger contactor is made to move on the outermost layer of the substrate at a rate of 10 mm/sec, and the coefficient of static friction and the coefficient of dynamic friction are measured. The coefficient of friction when the contactor starts moving from the resting state is defined as the coefficient of static friction, and the coefficient of friction when the contactor is moving is defined as the coefficient of dynamic friction.

As described above, the transparent substrate according to the first embodiment of the present invention comprises the antiglare layer 1 on the convex surface side of the substrate 1 as shown in FIG. 1. For example, the transparent substrate may be used as a cover glass of a display for on-vehicles. When a display device comprising the cover glass and a display is provided between the driver seat and the passenger seat, the driver and the passenger on the passenger seat can see the display through the cover glass from the direction of the edge region of the display. Accordingly, if light reflected from the surface of the cover glass corresponding to the surface on the center region of the display is significant, the display is difficult to see.

According to the transparent substrate of the present embodiment, the 60° specular glossiness at the edge region of the display device (display) is high, whereby the visibility of an image by the driver and the passenger on the passenger seat is increased, and at the same time, the 60° specular glossiness at the center region of the display device (display) is low, whereby the reflected light can be effectively suppressed. Further, when the surface roughness Ra of the antiglare layer decreases from the center region toward the edge region of the display device (display), the hand feeling improves toward the center region of the display, and accordingly an operation button and the like disposed at the center region can be recognized by touching.

Second Embodiment

Figure 2:
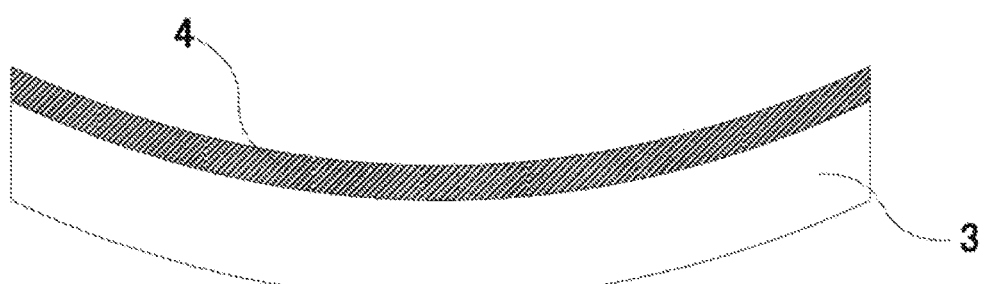
FIG. 2 is a cross-sectional view schematically illustrating a transparent substrate according to a second embodiment of the present invention.

A transparent substrate according to a second embodiment of the present invention comprises, for example, as shown in FIG. 2, a substrate 3 having a curved surface and an antiglare layer 4 formed on the substrate 3. Now, the transparent substrate according to the second embodiment of the present invention will be described with reference to FIG. 2.

The antiglare layer 4 may be a layer formed by roughening the surface of the substrate 3 e.g. by etching, or may be a roughened layer formed on the substrate 3. The antiglare layer 4 has irregularities with a predetermined roughness. In this embodiment, the antiglare layer 4 is formed on the concave surface side of the curved surface of the substrate 3. In the transparent substrate according to this embodiment, the 60° specular glossiness at the edge region close to the edge portion of the curved surface is low as compared with the 60° specular glossiness at the center region on the curved surface in the same substrate.

In the transparent substrate according to this embodiment, the difference of the absolute value between the 60° specular glossiness at the center region and the 60° specular glossiness at the edge region is higher than 20%. The 60° specular glossiness is more preferably from 100 to 140 at the center region and is from 80 to 120 at the edge region. The curve direction herein means the circumferential direction when the curved portion is observed from the cross-sectional direction. The points of the second embodiment different from the first embodiment are that the antiglare layer 4 is formed on the opposite side and that the 60° specular glossiness at the edge region is low as compared with that at the center region. The materials, the shape, etc. are the same as in the first embodiment.

The surface roughness Ra of the antiglare layer 4 is preferably at least 0.01 μm and at most 0.5 μm, more preferably at least 0.05 μm and at most 0.3 μm. The antiglare layer 4 may have a surface roughness Ra decreasing from the center region of the curved surface toward the edge region in the curve direction. The higher the surface roughness Ra, the more the hand feeling improves, and accordingly the difference in the position between the center region and the edge region can be felt by touching.

The material of the substrate 3 may be the same as described in the first embodiment. In a case where a roughened layer is formed on the substrate 3, the antiglare layer 4 is a film of which the matrix contains silica as the main component. The silica matrix preferably contains scaly particles such as scaly silica particles, scaly alumina particles, scaly titania particles or scaly zirconia particles. The scaly silica particles may be the same as described in the first embodiment.

The transparent substrate according to this embodiment may have a functional film on the antiglare layer 4. Such a functional film may, for example, be specifically an antireflection film, an antifouling film, an infrared shielding film, an ultraviolet shielding film, a water repellent film or an antistatic film. The transparent substrate may have any one of the above films or may have a combination of them.

The constitution of the antireflection film is not particularly limited so long as it can suppress reflection of light, and for example, the antireflection film may be a stacked layer of a high refractive index layer having a refractive index at a wavelength of 550 nm of from 1.70 to 2.70 and a low refractive index layer having a refractive index of froth 1.30 to 1.55, or a film which contains a layer having a refractive index at a wavelength of 550 nm of from 1.2 to 1.4 and containing hollow particles and holes in the film matrix.

The materials of the high refractive index layer and the low refractive index layer are not particularly limited and are properly selected considering the degree of the antireflection property required, the productivity, etc. The material constituting the high refractive index layer may, for example, be preferably at least one member selected from niobium oxide ($Nb_2O_5$), titanium oxide ($TiO_2$), zirconium oxide ($ZrO_2$), tantalum oxide ($Ta_2O_5$) and silicon nitride (SiN). The material constituting the low refractive index layer is preferably at least one member selected from silicon oxide ($SiO_2$), a material containing a mixed oxide of Si and Sn, a material containing a mixed oxide of Si and Zr, and a material containing a mixed oxide of Si and Al.

In a case where an antifouling film is formed, it is preferably formed as the outermost layer on the antiglare layer 4 or on other functional film. The thickness of the antifouling film is not particularly limited, and in a case where the antifouling film is composed of a fluorinated organic silicon compound coating film, its film thickness is preferably from 2 to 20 nm, more preferably from 2 to 15 nm, further preferably from 2 to 10 nm.

In a case where an antifouling film is formed, the coefficient of static friction of the surface of the outermost layer is preferably at most 1.0, more preferably at most 0.9, further preferably at most 0.8. When the coefficient of static friction is at most 1.0, favorable finger sliding property will be obtained when fingers touch the surface of the transparent substrate. Further, the coefficient of dynamic friction is preferably at most 0.02, more preferably at most 0.015, further preferably at most 0.01. The coefficient of static friction and the coefficient of dynamic friction may be measured by the method using the above-described apparatus.

As described above, the transparent substrate according to the second embodiment of the present invention comprises the antiglare layer 3 on the concave surface side of the substrate 3 as shown in FIG. 2. For example, the transparent substrate may be used as a cover glass of a display for on-vehicle. When a display device comprising the cover glass and a display is observed to watch the display through the cover glass from the front of the center region of the cover glass, if light reflected from the edge region at both sides is significant, the image may hardly be clearly recognized.

With respect to an image display device comprising a display and the transparent substrate according to this embodiment as a cover glass, the 60° specular glossiness at the edge region is low, whereby the reflected light from the edge region can be suppressed, and at the same time, the 60° specular glossiness at the center region is high, whereby the visibility of an image by the passenger located at the front of the center region of the display can be increased. Further, when the surface roughness Ra of the antiglare layer increases from the center region toward the edge region of the display, the hand feeling improves toward the edge region of the display, and accordingly an operation button and the like disposed at the edge region can be recognized by touching.

Third Embodiment

Figure 3:
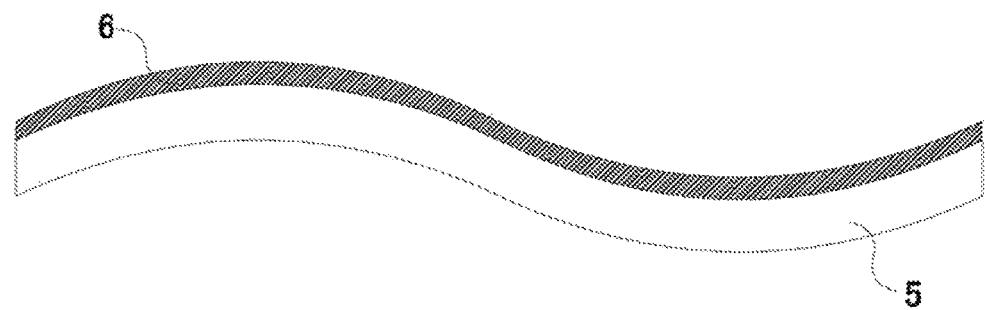
FIG. 3 is a cross-sectional view schematically illustrating a transparent substrate according to a third embodiment of the present invention.

A transparent substrate according to a third embodiment of the present invention comprises, for example, as shown in FIG. 3, a substrate 5 having two or more curved surfaces and an antiglare layer formed on the substrate 5. Now, the transparent substrate according to the third embodiment of the present invention will be described with reference to FIG. 3.

The antiglare layer 6 may be a layer formed by roughening the surface of the substrate 5 e.g. by etching, or may be a roughened layer formed on the substrate 5. The antiglare layer 6 has irregularities with a predetermined roughness. In this embodiment, the substrate 5 has two or more curved surfaces. The antiglare layer 6 is formed on either principal plane of the substrate 5. In the transparent substrate according to this embodiment, on each of the two or more curved surfaces, in a region where the antiglare layer 6 is formed on the convex surface side of the curved surface of the substrate 5, the 60° specular glossiness at the edge region closer to the edge portion of the curved surface is higher than the 60° specular glossiness at the center region of the curved surface, and in a region where the antiglare layer 6 is formed on the concave surface side of the curved surface of the substrate 5, the 60° specular glossiness at the edge region closer to the edge portion of the curved surface is lower than the 60° specular glossiness at the center region of the curved surface.

According to this embodiment, on each of the curved surfaces, the absolute value of the difference in the 60° specular glossiness between at the center region on the curved surface and at the edge region on the curved surface is higher than 20%. In a region where the antiglare layer 6 is formed on the convex surface side of the curved surface of the substrate 5, the 60° specular glossiness is more preferably from 80 to 120 at the center region and from 100 to 140 at the edge region, and in a region where the antiglare layer 6 is formed on the convex surface side of the curved surface of the substrate 5, the 60° specular glossiness is more preferably from 100 to 140 at the center region and from 80 to 120 at the edge region.

The curve direction means the circumferential direction when the curved portion is observed from the cross-sectional direction. This embodiment is a combination of the first and second embodiments, and the materials, etc. are the same as described above.

The surface roughness Ra of the antiglare layer 6 is preferably at least 0.01 μm and at most 0.5 μm, more preferably at least 0.05 μm and at most 0.3 μm. The antiglare layer 6 may have a surface roughness Ra changing from the center region of the curved surface toward the edge region in the curve direction on each of the two or more curved surfaces. In a region where the antiglare layer 6 is formed on the convex surface side of the curved surface of the substrate 5, the antiglare layer 6 has a surface roughness Ra decreasing from the center region of the curved surface toward the edge region in the curve direction, and in a region where the antiglare layer 6 is formed on the concave surface side of the curved surface of the substrate 5, the antiglare layer 6 has a surface roughness Ra increasing from the center region of the curved surface toward the edge region in the curve direction, whereby the difference in the position between at the center region and at the edge region can be felt by touching.

As the material of the substrate 5, the same material as in the above first embodiment may be used. In a case where a roughened layer is formed on the substrate 5, the antiglare layer 6 is a film of which the matrix contains silica as the main component. The silica matrix preferably contains scaly particles such as scaly silica particles, scaly alumina particles, scaly titania particles or scaly zirconia particles. As the scaly silica particles, the same particles as in the first embodiment may be used.

The transparent substrate according to this embodiment may have a functional film on the antiglare layer 6. Such a functional film may, for example, be specifically an antireflection film, an antifouling film, an infrared shielding film, an ultraviolet shielding film, a water repellent film or an antistatic film. The transparent substrate may have any one of the above films or may have a combination of them.

The constitution of the antireflection film is not particularly limited so long as it can suppress reflection of light, and for example, the antireflection film may be a stacked layer of a high refractive index layer having a refractive index at a wavelength of 550 nm of from 1.70 to 2.70 and a low refractive index layer having a refractive index of from 1.30 to 1.55, or a film which contains a layer having a refractive index at a wavelength of 550 nm of from 1.2 to 1.4 and containing hollow particles and holes in the film matrix.

The materials of the high refractive index layer and the low refractive index layer are not particularly limited and are properly selected considering the degree of the antireflection property required, the productivity, etc. The material constituting the high refractive index layer may, for example, be preferably at least one member selected from niobium oxide ($Nb_2O_5$), titanium oxide ($TiO_2$), zirconium oxide ($ZrO_2$), tantalum oxide ($Ta_2O_5$) and silicon nitride (SiN). The material constituting the low refractive index layer is preferably at least one member selected from silicon oxide ($SiO_2$), a material containing a mixed oxide of Si and Sn, a material containing a mixed oxide of Si and Zr, and a material containing a mixed oxide of Si and Al.

In a case where an antifouling film is formed, it is preferably formed as the outermost layer on the antiglare layer 6 or on other functional film. The thickness of the antifouling film is not particularly limited, and in a case where the antifouling film is composed of a fluorinated organic silicon compound coating film, its film thickness is preferably from 2 to 20 nm, more preferably from 2 to 15 nm, further preferably from 2 to 10 nm.

In a case where an antifouling film is formed, the coefficient of static friction of the surface of the outermost layer is preferably at most 1.0, more preferably at most 0.9, further preferably at most 0.8. When the coefficient of static friction is at most 1.0, favorable finger sliding property will be obtained when fingers touch the surface of the transparent substrate. Further, the coefficient of dynamic friction is preferably at most 0.02, more preferably at most 0.015, further preferably at most 0.01. The coefficient of static friction and the coefficient of dynamic friction may be measured by the method using the above-described apparatus.

As described above, the transparent substrate according to the third embodiment of the present invention has an antiglare layer on a substrate having two or more curved surfaces. By such a constitution, regions suitable for the driver and for the passenger on the passenger seat, and for the other passengers, can be provided.

Process for Producing Transparent Substrate

First Embodiment

Figure 4:
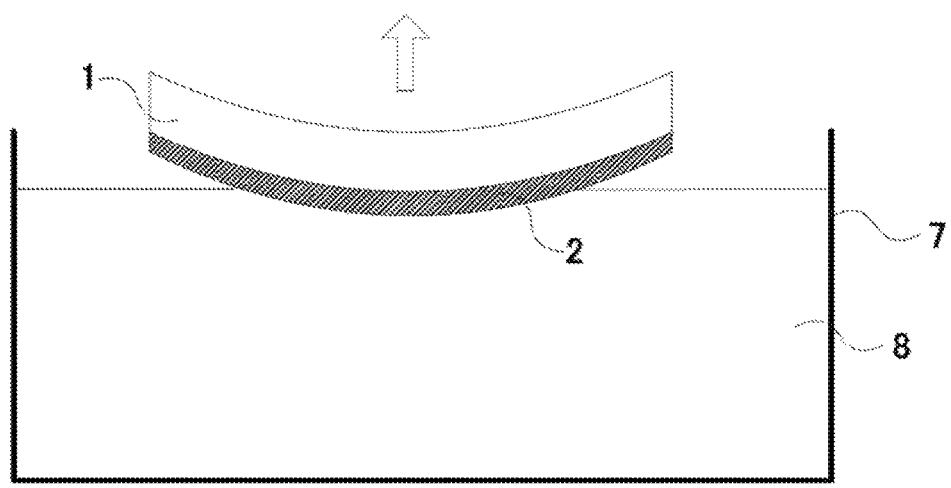
FIG. 4 is a cross-sectional view schematically illustrating an embodiment of a process for producing the transparent substrate according to the first embodiment of the present invention.

FIG. 4 is a cross-sectional view schematically illustrating an embodiment of a process for producing transparent substrate according to the first embodiment of the present invention. Now, an example of the process for producing the transparent substrate according to the first embodiment of the present invention will be described with reference to FIG. 4.

The production process is a process for forming an antiglare layer 2 by roughening the surface of a substrate 1 by etching. A shown in FIG. 4, the curved surface of the substrate 1 with the convex surface side facing downward, is brought into contact with treatment liquid 8 in a treatment vessel 7. Then, the substrate 1 is gradually lifted up while the convex surface side of the curved surface faces downward. The closer to the center region on the convex surface side of the curved surface, the longer the time over which the curved surface is in contact with the treatment liquid 8. Accordingly, the surface roughness Ra at the center region is higher than that at the edge region of the curved surface, and the 60° specular glossiness at the center region is from 80 to 120, when the 60° specular glossiness at the edge region of the curved surface is from 100 to 140. The lifting rate may be properly changed depending upon the desired degree of change of the surface roughness Ra. Since the 60° specular glossiness influences not only the surface roughness Ra but also parameters such as the maximum peak-to-valley height Rz and the surface roughness Rms, the treatment conditions are preferably adjusted depending upon the 60° specular glossiness.

The treatment liquid 8 may be any known treatment liquid, and in a case where the substrate 1 is made of glass, an etching liquid such as a hydrogen fluoride solution or a mixture of a hydrogen fluoride solution and another solution may be used. Frosting of dipping the substrate in a mixed solution of hydrogen fluoride and ammonium fluoride before dipping in the etching liquid, followed by etching, may be conducted.

The surface not to be roughened by etching (concave surface side in this embodiment) may be masked e.g. by bonding a film or by forming a protective film.

Figure 5:
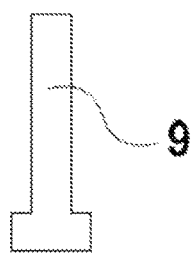
FIG. 5 is a cross-sectional view schematically illustrating another embodiment of a process for producing the transparent substrate according to the first embodiment of the present invention.
Figure 5:
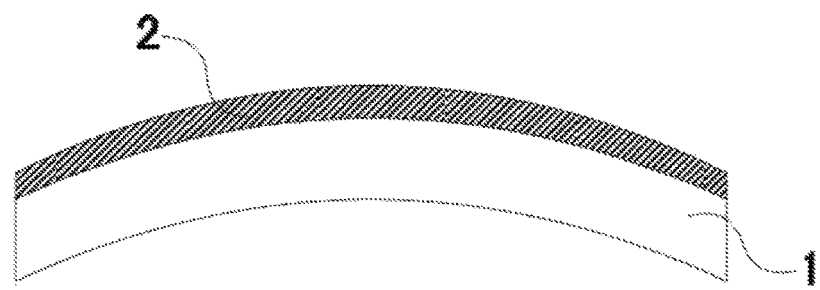

Otherwise, the transparent substrate according to the first embodiment may be produced, as shown in FIG. 5, by forming an antiglare film on the substrate 1 to make an antiglare layer 2. An antiglare film may be usually produced by applying a liquid medium containing a silica precursor such as a silane compound having a hydrocarbon group bonded to a silicon atom and a hydrolysable group and its hydrolytic condensate, an alkoxysilane and its hydrolytic condensate (sol gel silica) or silazane.

The liquid medium may contain particles, and in a case where it contains scaly particles, the scaly particles are preferably contained in the liquid medium before application. The liquid medium may be water alone, or may be a mixture of water and other liquid. Such other liquid may, for example, be an alcohol, a ketone, an ether, a cellosolve, an ester, a glycol ether, a nitrogen-containing compound or a sulfur-containing compound.

The total content of the silica precursor and the particles contained in the liquid medium is preferably from 30 to 100 mass %, more preferably from 40 to 100 mass % based on the solid content (100 mass %) in the liquid medium (provided that the content of the silica precursor is as calculated as $SiO_2$). When the total content of the silica precursor and the particles is at least the lower limit above range, the resulting antiglare film is excellent in the adhesion to the bent substrate. When the total content of the silica precursor and the particles is at most the upper limit of the above range, cracking or film peeling of the antiglare film can be suppressed.

In this embodiment, as shown in FIG. 5, an antiglare film is formed on the substrate 1 by blowing the liquid medium from a nozzle 9 disposed at the convex surface side of the substrate 1. As the nozzle 9, a conventional nozzle may be used, for example, a nozzle of a droplet-forming type such as a two-fluid spray, an airless type or a rotary atomizing type or a nozzle of an electrostatic coating type may be used. Since the substrate 1 has a curved portion, when the nozzle 9 is sufficiently small relative to the size of the glass, the distance from the nozzle 9 is different between at the center region and the edge region of the substrate 1. Specifically, since the distance from the nozzle 9 at the edge region is longer than at the center region of the substrate 1, the concavo-convex structure is hardly formed at the edge region due to a decrease of the spray droplet coating efficiency, and on the film after baking, the antiglare performance is low and the 60° specular glossiness is high at the edge region as compared with the center region.

In the process for producing the transparent substrate according to this embodiment, the area of an exhaust port of the nozzle 9 is at most 20% of the area of the substrate 1 as observed from the direction of the nozzle 9 (hereinafter referred to as the top-viewed substrate area). By positively making a difference in the distance from the nozzle 9 between the center region of the substrate 1 and the edge region, a transparent substrate with an absolute value of the difference between the 60° specular glossiness at the center region and the 60° specular glossiness at the edge region of higher than 20% can be produced.

The surface temperature of the substrate 3 when the liquid medium is applied is preferably from 15 to 50° C., more preferably from 20 to 40° C. When the surface temperature of the substrate 3 is at least the lower limit of the above range, the liquid medium will rapidly evaporate, whereby a sufficient concavo-convex structure tends to be formed. When the surface temperature of the substrate 3 is at most the upper limit of the above range, the adhesion between the substrate 3 and the antiglare film will be favorable.

After the liquid medium is applied, baking is carried out to form the antiglare layer 2. Baking may be carried out simultaneously with application by heating the substrate when the liquid medium is applied, or may be carried out by heating the coating film after the liquid medium is applied to the substrate. The baking temperature is preferably at least 30° C., and for example, when the substrate 1 is glass, it is more preferably from 100 to 750° C., further preferably from 150 to 550° C.

Second Embodiment

Figure 6:
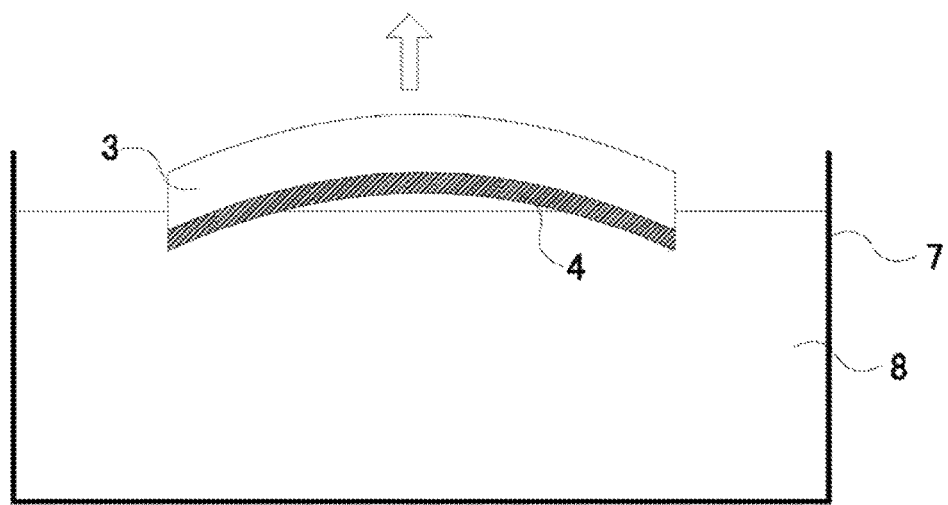
FIG. 6 is a cross-sectional view schematically illustrating an embodiment of a process for producing the transparent substrate according to the second embodiment of the present invention.

FIG. 6 is a cross-sectional view schematically illustrating an embodiment of a process for producing the transparent substrate according to the second embodiment of the present invention. Now, an example of the process for producing the transparent substrate according to the second embodiment of the present invention will be described with reference to FIG. 6.

The production process is a process for forming an antiglare layer 4 by roughening the surface of a substrate 3 by etching. As shown in FIG. 6, the curved surface of the substrate 3 with the concave surface side facing downward, is brought into contact with a treatment liquid 8 in a treatment vessel 7. Then, the substrate 3 is gradually lifted up while the concave surface side of the curved surface faces downward. The closer to the edge region on the concave surface side of the curved surface, the longer the time over which the curved surface is in contact with the treatment liquid 8. Accordingly, the surface roughness Ra at the edge region is higher than that at the center region of the curved surface, and the 60° specular glossiness at the edge region is from 80 to 120, when the 60° specular glossiness at the center region of the curved surface is from 100 to 140. The lifting rate may be properly changed depending upon the desired degree of change of the surface roughness Ra. Since the 60° specular glossiness influences not only the surface roughness Ra but also parameters such as the maximum peak-to-valley height and the surface roughness Rms, the treatment conditions are preferably adjusted depending upon the 60° specular glossiness.

The treatment liquid 8 may be any known treatment liquid, and in a case where the substrate 3 is made of glass, an etching liquid such as a hydrogen fluoride solution or a mixture of a hydrogen fluoride solution and another solution may be used. Frosting of dipping the substrate in a mixed solution of hydrogen fluoride and ammonium fluoride before dipping in the etching liquid, followed by etching, may be conducted.

Figure 7:
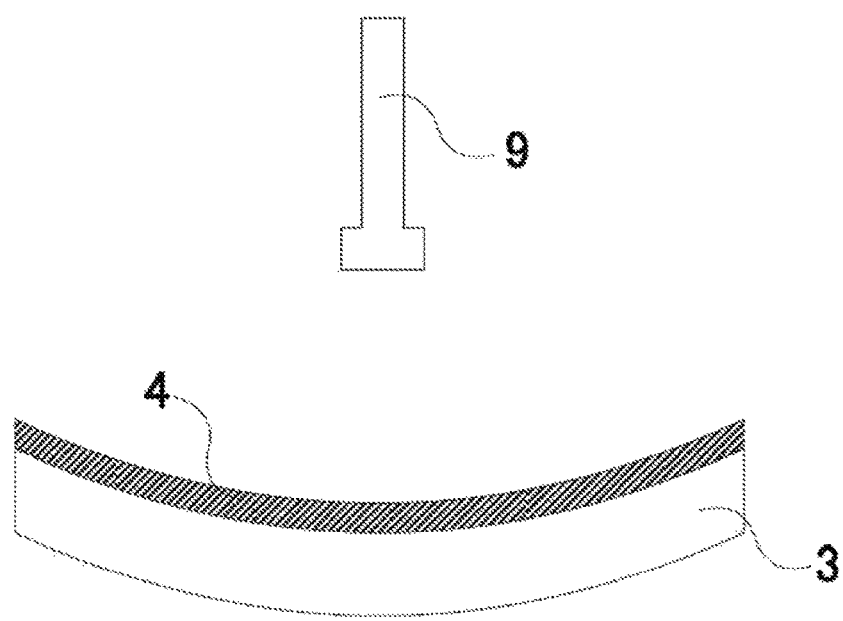
FIG. 7 is a cross-sectional view schematically illustrating another embodiment of a process for producing the transparent substrate according to the second embodiment of the present invention.

Otherwise, the transparent substrate according to the second embodiment may be produced, as shown in FIG. 7, by forming an antiglare film on the substrate 3 to make an antiglare layer 4. An antiglare film may be usually produced by applying a liquid medium containing a silica precursor such as a silane compound having a hydrocarbon group bonded to a silicon atom and a hydrolysable group and its hydrolytic condensate, an alkoxysilane and its hydrolytic condensate (sol gel silica) or silazane.

The liquid medium may contain particles, and in a case where it contains scaly particles, the scaly particles are preferably contained in the liquid medium before application. The liquid medium may be water alone, or may be a mixture of water and other liquid. Such other liquid may, for example, be an alcohol, a ketone, an ether, a cellosolve, an ester, a glycol ether, a nitrogen-containing compound or a sulfur-containing compound.

The total content of the silica precursor and the particles contained in the liquid medium is preferably from 30 to 100 mass %, more preferably from 40 to 100 mass % based on the solid content (100 mass %) in the liquid medium (provided that the content of the silica precursor is as calculated as $SiO_2$). When the total content of the silica precursor and the particles is at least the lower limit of the above range, the resulting antiglare film is excellent in the adhesion to the bent substrate. When the total content of the silica precursor and the particles is at most the upper limit of the above range, cracking or film peeling of the antiglare film can be suppressed.

In this embodiment, as shown in FIG. 7, an antiglare film is formed on the substrate 3 by blowing the liquid medium from a nozzle 9 disposed at the concave surface side of the substrate 3. On that occasion, the antiglare film is formed preferably by relatively moving the nozzle 9 and the substrate 3. For example, in FIG. 7, the nozzle is fixed, and the substrate 3 is moved from the left side to the right side in the drawing. By such an operation, the desired antiglare layer 4 can be formed on the desired position of the substrate 3. As the nozzle 9, a conventional nozzle may be used, for example, a two-fluid spray or a nozzle of an electrostatic coating type may be used. Since the substrate 3 has a curved portion, when the nozzle 9 is sufficiently small relative to the size of the glass, the distance from the nozzle 9 is different between at the center region and the edge region of the substrate 3. Specifically, in a case where the nozzle is fixed and the substrate 3 is moved from the left side to the right side in the drawing, since the distance from the nozzle 9 at the center region is longer than at the edge region of the substrate 3, the concavo-convex structure is hardly formed at the center region due to a decrease of the spray droplet coating efficiency, and on the film after baking, the antiglare performance is low and the 60° specular glossiness is high at the center region as compared with the edge region.

In the process for producing the transparent substrate according to this embodiment, the area of an exhaust port of the nozzle 9 is at most 20% of the top-viewed substrate 3 area. By positively making a difference in the distance from the nozzle 9 between the center region of the substrate 3 and the edge region, a transparent substrate with an absolute value of the difference between the 60° specular glossiness at the center region and the 60° specular glossiness at the edge region of higher than 20% can be produced.

The surface temperature of the substrate 3 when the liquid medium is applied is preferably from 15 to 50° C., more preferably from 20 to 40° C. When the surface temperature of the substrate 3 is at least the lower limit of the above range, the liquid medium will rapidly evaporate, whereby a sufficient concavo-convex structure tends to be formed. When the surface temperature of the substrate 3 is at most the upper limit of the above range, the adhesion between the substrate 3 and the antiglare film will be favorable.

After the liquid medium is applied, baking is carried out to form the antiglare layer 4. Baking may be carried out simultaneously with application by heating the substrate when the liquid medium is applied, or may be carried out by heating the coating film after the liquid medium is applied to the substrate. The baking temperature is preferably at least 30° C., and for example, when the substrate 3 is glass, it is more preferably from 100 to 750° C., further preferably from 150 to 550° C.

Third Embodiment

A process for producing the transparent substrate according to a third embodiment is a combination of the first and second embodiments, and detailed description is omitted.

Modified Example

As described above, the present invention is not limited to the above embodiments, and various changes and modifications by those skilled in the art by combining the embodiments based on the description in this specification and known conventional technology are possible.

For example, the substrate or the transparent substrate (hereinafter referred to as an object to be processed) may be subjected to the following process/treatment.

At least one principal plane of the object to be processed may be ground or abraded.

(Edge Processing/Drilling Step)

The edge of the object to be processed may be chamfered or may be subjected to another treatment. The edge is preferably subjected to processing commonly called round chamfering or corner chamfering by mechanical grinding, or the edge may be etched, and the processing is not particularly limited. Further, a plate-shape glass to be formed may be preliminarily subjected to edge processing and then subjected to a forming step to form a substrate having a curved portion.

Further, the object to be processed may be subjected to drilling or cutting before or after the forming step.

(Tempering Step)

As a tempering method to form a surface compressive stress layer on the objected to be processed, physical tempering method or chemical tempering method may be employed. The object to be processed having the glass principal plane tempered has high mechanical strength. In this constitution, any tempering means may be employed, and in order to obtain an object to be processed being thin and having a high surface compressive stress (CS), tempering by chemical tempering is preferred.

The tempering step is preferably conducted after the forming step.

[Chemical Tempering Step]

By chemical tempering, a compressive stress layer is formed on the surface of the object to be processed to increase the strength and the scratch resistance. Chemical tempering is a treatment to form a compressive stress layer on the glass surface by replacing alkali metal ions having a small ion radius (typically Li ions or Na ions) on the glass surface with alkali metal ions having a larger ion radius (typically Na ions for Li ions or K ions for Na ions) by ion exchange at a temperature of at most the glass transition point. The chemical tempering treatment may be conducted by a conventional method, and typically, glass is dipped in a potassium nitrate molten salt. Potassium carbonate may be contained in an amount of at most 10 mass % in the molten salt. By such a treatment, cracking and the like on the surface layer of glass may be removed to obtain high strength glass. Otherwise, potassium nitrate mixed salt having sodium nitrate mixed may be used, or water vapor, carbon dioxide gas or the like may be blown into the potassium nitrate molten salt. By mixing a silver component such as silver nitrate in potassium nitrate at the time of chemical tempering, the glass is ion-exchanged to have silver ions on its surface, whereby antibacterial activity is imparted.

(Formation of Printed Layer)

A printed layer may be formed by any printing method or by an ink (printing material) depending upon the application. The printing method may, for example, be spray printing, ink jet printing or screen printing. By such a method, even a large object to be processed may be favorably printed. Particularly by spray panting, an object to be processed having a curved portion will readily be printed, and the surface roughness on the printed surface will readily be adjusted. On the other hand, by screen printing, a desired print pattern will readily be formed on a large object to be processed with a uniform thickness. Further, although two or more types of ink may be used, a single ink is preferred from the viewpoint of the adhesion of the printed layer. The ink forming the printed layer may be either inorganic or organic.

EXAMPLES

Now, the present invention be described in further detail with reference to Examples. However, it should be understood that the present invention is by no means restricted thereto.

Ex. 1 and 2 are Examples of the present invention, and Ex. 3 is a Comparative Example.

Evaluation methods and materials used in each Ex. are shown below.

<Evaluation Method>

The "60° specular glossiness" was measured by the method in JIS Z8741:1997, 60° specular glossiness, by a gloss meter (MULTI GLOSS 268Plus manufactured by Konica Minolta, Inc.) without eliminating the back reflection of the substrate with an antiglare layer.

The "haze" was measured bar a method in accordance with JIS K7136:2000 (ISO14782:1999) by a haze meter (HR-100 manufactured by MURAKAMI COLOR RESEARCH LABORATORY).

The "arithmetic mean roughness Ra" was measured by a method in accordance with JIS B0601:2001 (ISO4287: 1997) by a surface roughness measuring machine (SURF-COM 130A manufactured by TOKYO SEIMITSU CO., LTD.). The measurement length was 4 mm.

<Preparation of Substrate Having a Film Formed Thereon by Electrostatic Coating Method. Ex. 1 and Ex. 2>

[Material Used]

(Production of Scaly Silica Particle Dispersion (a))

A silica dispersion was prepared in the same manner as in Example 1 of JP-A-2014-094845, and treated with an acid and washed, treated with an alkali, wet-ground and finally cation-exchanged to prepare a silica dispersion. The silica dispersion after the cation exchange was treated with an ultrafiltration film (manufactured by DAICEN MEMBRANE-SYSTEMS Ltd., MOLSEP (registered trademark), molecular cutoff: 150,000), and the concentration of the silica dispersion was adjusted.

Silica particles were taken out from the obtained silica dispersion (scaly silica particle dispersion (a)) and observed by TEM, and confirmed to be composed solely of scaly silica particles containing substantially no irregular silica particles.

The average particle size of the scaly silica particles contained in the scaly silica particle dispersion (a) was 0.182 µm, which was the same as that after the wet grinding. The average aspect ratio was 188.

The solid content concentration of the scaly silica particle dispersion (a) measured by an infrared moisture meter was 5.0 mass %.

(Preparation of Base Liquid (b))

To 34.3 g of modified ethanol (manufactured by Japan Alcohol Trading Co., Ltd., SOLMIX (registered trademark) AP-11, a mixed solvent containing ethanol as the main component, boiling point: 78° C., the same applies hereinafter) with stirring, 4.2 g of silicate 40 (manufactured by Tama Chemicals, Co., Ltd., a mixture of tetraethoxysilane and its hydrolytic condensate solid content concentration (as calculated as $SiO_2$): 40 mass %, solvent: ethanol (at most 10%), the same applied hereinafter) and 2.0 g of the scaly silica particle dispersion (a) were added, followed by stirring for 30 minutes. To the mixture, a mixed liquid of 3.6 g of deionized water and 0.06 g of an aqueous nitric acid solution (nitric acid concentration: 61 mass %) was added, followed by stirring for 60 minutes to prepare a base liquid (b) having a solid content concentration (as calculated as $SiO_2$) of 4.0 mass %. The solid content concentration as calculated as $SiO_2$ is a solid content concentration assuming that the entire Si in silicate 40 is converted to $SiO_2$.

(Preparation of Silane Compound Solution (c))

To 3.85 g of modified ethanol with stirring, a mixed liquid of 0.4 g of deionized water and 0.01 g of an aqueous nitric acid solution (nitric acid concentration: 61 mass %) was added, followed by stirring for 5 minutes. 0.5 g of 1,6-bis (trimethoxysilyl)hexane (manufacture by Shin-Etsu Chemical Co., Ltd., KBM-3066, solid content concentration (as calculate as $SiO_2$): 37 mass %) was added, followed by stirring in a water bath at 60° C. for 15 minutes to prepare a silane compound solution (c) having, a solid content concentration (as calculated as $SiO_2$) of 4.3 mass %.

(Preparation of Composition (d))

To 44.1 g of the base liquid (b) with stirring, 4.8 g of the saline compound solution (c) was added, followed by g for 60 minutes. To the mixture, 146.7 g of modified ethanol was added, followed by stirring at room temperature for 30 minutes to obtain a position (d) having a solid content concentration (as calculated as $SiO_2$) of 1.0 mass %.

[Preparation of Substrate]

As a curved substrate, aluminosilica glass (Dragontrail (tradename), manufactured by Asahi Glass Company, Limited, a glass substrate with size: x=500 mm, y=200 mm (curve depth h=65 mm) and thickness t=1.1 mm) having a curved portion and a flat portion as shown in FIG. 7 was prepared. The curved substrate was subjected to a chemical tempering treatment to form a compressive stress layer with a compressive stress of 750 MPa and depth of layer of 28 µm. The surface of the glass was washed with an aqueous cerium oxide dispersion, rinsed with deionized water and dried. When the curved substrate was placed on a flat surface so that the convex side faced upward, and the ground point on the flat surface was taken as a height 0% and the point farthest from the flat surface 100%, the center region is a region with a height of 58.5 to 65 mm corresponding to a 90 to 100% height, and the edge region is a region with a height of from 0 to 6.5 mm corresponding to a 0 to 10% height.

[Electrostatic Coating Apparatus]

An electrostatic coating apparatus (liquid electrostatic coater, manufactured by ASAHI SUNAC CORPORATION) was prepared, and as an electrostatic coating gun, a rotary atomizing electrostatic automatic coating gun (manufactured by ASAHI SUNAC CORPORATION, Sun Bell ESA120, cup diameter: 70 mm) was prepared.

As an electrically conductive substrate on which the substrate was to be placed, a carbon electrically conductive substrate was prepared. The electrically conductive substrate was processed so as to have a shape which agreed with the contact surface of the curved substrate on which a film was to be formed.

Electrostatic Coating

Ex. 1

The temperature in a coating booth of the electrostatic coating apparatus was set to be 25±1° C. and the humidity was set to be 50%±10%.

On a chain conveyer of the electrostatic coating apparatus, a substrate was placed via the carbon electrically conductive substrate. While the substrate was carried at a constant speed by the chain conveyer, the composition (d) was applied to the top surface (the opposite side from the surface which was contact with molten tin at the time of production by float process) of the curved substrate by an electrostatic coating method under application conditions as shown in Table 1 and baked in the air at 300° C. for 60 minutes to prepare a curved substrate with an antiglare layer.

Ex 2

Electrostatic coating was conducted under the same condition as in Ex. 1 except for the number of application. The application conditions in Ex. 1 and 2 are shown in Table 1. In Ex. 1 and 2, the film was formed on the concave surface side of the curved portion.

TABLE 1

|  | Ex. 1 | Ex. 2 |
|---|---|---|
| Voltage applied (kV) | −60 | −60 |
| Coating liquid amount (mL/min) | 25 | 25 |

TABLE 1-continued

|  | Ex. 1 | Ex. 2 |
|---|---|---|
| Distance from nozzle tip to bottom of glass plate bottom (mm) | 250 | 250 |
| Number of revolutions of cup (krpm) | 35 | 35 |
| Number of application (time) | 1 | 2 |

Ex. 3

In Ex. 3, an antiglare film was formed on the concave surface side of the curved portion by a spray method, differently from Ex. 1 and 2.

[Materials Used]

The air discharge pressure of a VAU nozzle was set at 0.4 MPa, and the VAU nozzle is moved on a washed curved substrate 3 in a lateral direction at a rate of 750 mm/min, moved 22 mm ahead, and then moved on the curved substrate 3 in a lateral direction at a rate of 750 mm/min. On that occasion, the nozzle was moved so that the distance between glass and the VAU nozzle was constant at 200 mm. Moving of the VAU nozzle was conducted until the entire surface of the washed curved substrate 3 preliminarily heated at 90° C.±3° C. was scanned with the VAU nozzle. Such a curved substrate which was entirely coated with the composition will be referred to as the single coated substrate. Further, the curved substrate may further be coated with the composition more time in the same manner as above one. By coating the curved substrate similarly, a triply or more coated substrate may be obtained. The composition (d) was applied under the application conditions as identified in Table 2, followed by baking in the air at 300° C. for 60 minutes to obtain a curved substrate with an antiglare layer.

TABLE 2

|  | Ex. 3 |
|---|---|
| Number of application (time) | 2 |
| Coating liquid amount (mL/min) | 30 |
| Distance from nozzle tip to glass plate (mm) | 225 |
| Glass surface temperature | 90 |
| Tip atomized air (MPa) | 0.25 |

<Evaluation Results>

Of the transparent substrates in Ex. 1 to 3, the 60° specular glossiness and the surface roughness Ra were evaluated. The results are shown in Table 3. Of the transparent substrates in Ex. 1 and 2, the absolute value of the difference in the 60° specular glossiness between at the center region of the curved portion (correspond to heights of 61 mm and 62 mm from the flat surface) and at the edge region (corresponding to a height of 4 mm from the flat surface) was higher than 20%. Further, in Ex. 1 and 2, the antiglare film was excellent in the appearance without defects or the like. On the other hand, on the transparent substrate in Ex. 3, an antiglare film was formed of which the 60° specular glossiness at the flat portion was the same as that at the curved portion.

TABLE 3

|  |  | Height from flat surface (mm) | | | | | |
|---|---|---|---|---|---|---|---|
|  |  | 62 | 61 | 52 | 38 | 18 | 4 |
| Ex. 1 | 60° specular glossiness | 60.9 | 60.4 | 57.2 | 51.6 | 41.7 | 35.8 |
|  | Ra (µm) | 0.10 | 0.11 | 0.11 | 0.13 | 0.14 | 0.16 |

TABLE 3-continued

|  |  | Height from flat surface (mm) | | | | | |
| --- | --- | --- | --- | --- | --- | --- | --- |
|  |  | 62 | 61 | 52 | 38 | 18 | 4 |
| Ex. 2 | 60° specular glossiness | 75.9 | 76 | 72.1 | 66.3 | 52.3 | 42.6 |
|  | Ra (μm) | 0.04 | 0.05 | 0.06 | 0.08 | 0.12 | 0.14 |
| Ex. 3 | 60° specular glossiness | 122 | 126 | 125 | 123 | 122 | 123 |
|  | Ra (μm) | 0.064 | 0.062 | 0.061 | 0.062 | 0.064 | 0.062 |

The entire disclosure of Japanese Patent Application No. 2016-148399 filed on Jul. 28, 2016 including specification, claims, drawings and summary is incorporated herein by reference in its entirety.

REFERENCE SYMBOLS 1, 3, 5: Substrate
2, 4, 6: Antiglare layer
7: Treatment vessel
8: Treatment liquid
9: Nozzle

What is claimed is:

1. A transparent substrate comprising a substrate having a curved surface on at least a part of its front surface, and an antiglare layer formed on the center region and the edge region of the curved surface, wherein the absolute value of the difference between the 60° specular glossiness at the center region and the 60° specular glossiness at the edge region is higher than 20%.

2. The transparent substrate according to claim 1, wherein the 60° specular glossiness at the center region is lower than the 60° specular glossiness at the edge region.

3. The transparent substrate according to claim 2, wherein the 60° specular glossiness at the center region is from 80 to 120, and the 60° specular glossiness at the edge region is from 100 to 140.

4. The transparent substrate according to claim 3, wherein the antiglare layer has a surface roughness Ra decreasing from the center region on the curved surface toward the edge region in the curve direction.

5. The transparent substrate according to claim 1, wherein the 60° specular glossiness at the center region is higher than the 60° specular glossiness at the edge region.

6. The transparent substrate according to claim 5, wherein the 60° specular glossiness at the edge region is from 80 to 120, and the 60° specular glossiness at the center region is from 100 to 140.

7. The transparent substrate according to claim 6, wherein the antiglare layer has a surface roughness Ra increasing from the center region on the curved surface toward the edge region in the curve direction.

8. The transparent substrate according to claim 1, wherein the antiglare layer is formed by etching the substrate.

9. The transparent substrate according to claim 1, wherein the antiglare layer is a film containing silicon as the main component formed on the substrate.

10. The transparent substrate according to claim 1, wherein the substrate has two or more curved surfaces.

11. The transparent substrate according to claim 1, wherein the substrate is made of glass.

12. The transparent substrate according to claim 11, wherein the glass has a compressive stress layer on its surface.

13. The transparent substrate according to claim 1, which has a printed layer on at least a part of the rear side of the substrate.

14. A display device comprising a cover glass and a display, wherein the cover glass is the transparent substrate as defined in claim 1.

15. The display device according to claim 14, which is for on-vehicle.

16. A process for producing a transparent substrate, which comprises a step of preparing a substrate having a curved surface on at least a part of its front surface, a step of dipping the substrate in a treatment liquid, and a step of taking the substrate out from the treatment liquid so that the absolute value of the difference between the 60° specular glossiness at the center region of the curved surface and the 60* specular glossiness at an edge region of the curved surface is higher than 20%.

* * * * *